(12) United States Patent
Lee

(10) Patent No.: US 6,605,835 B2
(45) Date of Patent: Aug. 12, 2003

(54) FERROELECTRIC MEMORY AND ITS METHOD OF FABRICATION

(75) Inventor: Sung-Yung Lee, Seoul (KR)

(73) Assignee: Samsung Electronics Co., Ltd., Suwon (JP)

( * ) Notice: Subject to any disclaimer, the term of this patent is extended or adjusted under 35 U.S.C. 154(b) by 0 days.

(21) Appl. No.: 10/052,033

(22) Filed: Jan. 15, 2002

(65) Prior Publication Data
US 2002/0149041 A1 Oct. 17, 2002

(30) Foreign Application Priority Data
Apr. 11, 2001 (KR) .................... 2001- 0019305

(51) Int. Cl.⁷ .................... H01L 29/76; H01L 29/94; H01L 31/062; H01L 31/113; H01L 31/119
(52) U.S. Cl. .................... 257/295; 257/296
(58) Field of Search .................... 257/295, 296, 257/301, 303, 306, 310, 315, 532

(56) References Cited
U.S. PATENT DOCUMENTS 6,011,284 A * 1/2000 Katori et al. ............ 257/295
6,144,060 A * 11/2000 Park et al. ............ 257/310
6,201,726 B1 * 3/2001 Evans ............ 365/145
6,242,299 B1 * 6/2001 Hickert ............ 438/240
6,396,092 B1 * 5/2002 Takatani et al. ............ 257/295

* cited by examiner

*Primary Examiner*—David Nhu
(74) *Attorney, Agent, or Firm*—Marger Johnson & McCollom, P.C.

(57) ABSTRACT

A ferroelectric memory device has a lower electrode, ferroelectric layer and a first portion of an upper electrode that are formed as a stack over a semiconductor substrate. Sidewalls of the stack are covered with a second portion of the upper electrode. An insulating spacer is disposed between the lower electrode and the second portion of the upper electrode. The second portion of the upper electrode is electrically connected to the first portion of the upper electrode yet electrically insulated by the insulating spacer from the lower electrode. At least one of the first and second portions of the upper electrode is formed of a hydrogen barrier layer to protect the ferroelectric layer of the stack from hydrogen ions.

9 Claims, 4 Drawing Sheets

FERROELECTRIC MEMORY AND ITS METHOD OF FABRICATION

This application claims benefit and priority of Korean Patent Application No. 2001-19305, filed on Apr. 11, 2001, the contents of which are incorporated herein by reference in its entirety.

FIELD OF THE INVENTION

The present invention generally relates to a semiconductor device and its method of fabrication and, more specifically, to a ferroelectric memory having ferroelectric capacitors and its method of fabrication.

BACKGROUND

A ferroelectric memory is a type of nonvolatile memory that is able to keep previously stored data when power is lost. Furthermore, the ferroelectric memory device can operate at low voltage similarly to DRAM and SRAM. Because of these characteristics, ferroelectric memory devices are being more widely used in smart card applications.

FIG. 1 is a cross-sectional view illustrating a portion of a conventional ferroelectric memory device.

Referring to FIG. 1, a lower interlayer insulating layer 3 is deposited on semiconductor substrate 1. A predetermined region of semiconductor substrate 1 is in contact with contact plug 5, which passes through a predetermined region of the lower interlayer insulating layer 3. A lower electrode 7, which is in contact with an upper surface of contact plug 5, is located on the lower interlayer insulating layer 3. A ferroelectric layer 9 and upper electrode 11 are stacked over the lower electrode 7. A PZT ($PbZrTiO_3$) or BST ($BaSrTiO_3$) are commonly used for the ferroelectric material of layer 9. The stack of lower electrode 7, ferroelectric layer 9 and upper electrode 11 forms a ferroelectric capacitor. In addition, upper insulating layer 13 can be deposited over the ferroelectric capacitor and the lower interlayer insulating layer 3. Here, the lower interlayer insulating layer 3 and the upper insulating layer 13 may comprise, e.g., silicon oxide.

As described above, according to an exemplary known device, a sidewall of the ferroelectric layer 9 is directly exposed and in contact with subsequently formed insulating layer 13 such as, e.g., silicon oxide. Accordingly, during possible processes such as, e.g., a plasma process, a characteristic of the ferroelectric can be deteriorated. In other words, hydrogen ions of a plasma process might penetrate and damage the ferroelectric layer. If the hydrogen ions reach the ferroelectric, a chemical reduction reaction may occur, in which the hydrogen ions may react with oxygen atoms of the ferroelectric to generate oxygen vacancies. Thus, a crystalline structure of the ferroelectric layer is destroyed and a polarization characteristic deteriorated.

Additionally, if hydrogen ions are captured or trapped at the interface between the ferroelectric and the upper or lower electrodes, an energy barrier or level therebetween is lowered. Accordingly, with a reduced barrier energy, a leakage current characteristic of the ferroelectric capacitor is degraded.

SUMMARY

In accordance with an exemplary embodiment of the present invention, a ferroelectric memory comprises a hydrogen barrier on a sidewall of a ferroelectric layer disposed between two electrodes.

In accordance with another exemplary embodiment of the present invention, a method of fabricating a ferroelectric memory comprises protecting ferroelectric material from hydrogen ions.

In accordance with a particular exemplary embodiment, a ferroelectric memory comprises a lower electrode over a semiconductor substrate. A ferroelectric layer is disposed over the lower electrode. A first portion of an upper electrode may be disposed over the ferroelectric layer and an insulating spacer disposed in contact with a sidewall of the lower electrode. A second portion of the upper electrode may cover a sidewall of the insulating spacer and contact at least part of the first portion of the upper electrode. The second portion of the upper electrode may be electrically insulated from the lower electrode by the insulating spacer, and electrically connected to the first portion of the upper electrode. In accordance with a further embodiment, insulating spacer may also cover a sidewall of the ferroelectric layer.

In accordance with another embodiment, the first and the second portion of the upper electrode may comprise a hydrogen barrier layer. In further embodiments the hydrogen barrier layer may comprise an iridium layer (Ir), an iridium oxide layer ($IrO_2$) or a combination thereof.

In accordance with another exemplary embodiment, a method of fabricating a ferroelectric memory comprises forming a stack of a lower electrode, a ferroelectric layer and a first portion of an upper electrode over a substrate. An insulating spacer is formed against a sidewall of the lower electrode. In accordance with an optional aspect, the insulating spacer may be formed to also cover a sidewall of the ferroelectric layer as well as the sidewall of the lower electrode. Continuing the exemplary embodiment, a second portion for the upper electrode may be formed to cover a sidewall of the insulating spacer and at least a portion of the first portion of the upper electrode.

In accordance with further exemplary embodiments, the first portion of the upper electrode may be formed with a hydrogen barrier layer. In such embodiments, the hydrogen barrier layer may be formed of an iridium layer (Ir), an iridium oxide layer ($IrO_2$) or a combination thereof.

In a further exemplary embodiment, the insulating spacer may be formed by depositing an insulating layer such as an oxide layer over the substrate and over the patterned stack of the lower electrode, the ferroelectric layer and the first portion of the upper electrode. The deposited insulating layer might then be anisotropically etched to expose at least a part of the first portion of the upper electrode.

In accordance with another exemplary embodiment, the second portion of the upper electrode may be formed by depositing a hydrogen barrier layer over the substrate and the insulating spacer, and then anisotropically etching the hydrogen barrier layer.

BRIEF DESCRIPTION OF THE DRAWINGS

The above and other features and advantages of the present invention will become readily apparent from the description that follows, with reference to the accompanying drawings, in which.

DETAILED DESCRIPTION OF THE PREFERRED EMBODIMENT

Figure 1:
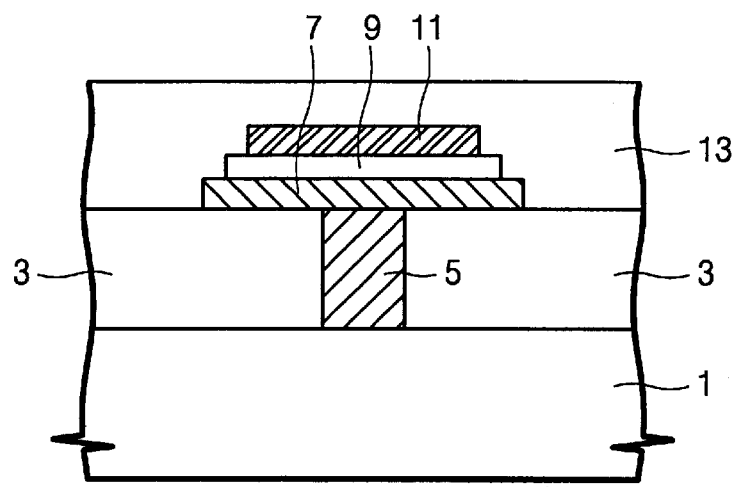
FIG. 1 is a cross-sectional view illustrating a conventional ferroelectric capacitor.

The present invention will be described more fully hereinafter with reference to the accompanying drawings, in which preferred embodiments of the invention are shown. This invention, however, can be embodied in many different forms and should not be construed as limited to the particular exemplary embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present. The drawings will also include like numbers to reference like elements.

Figure 2:
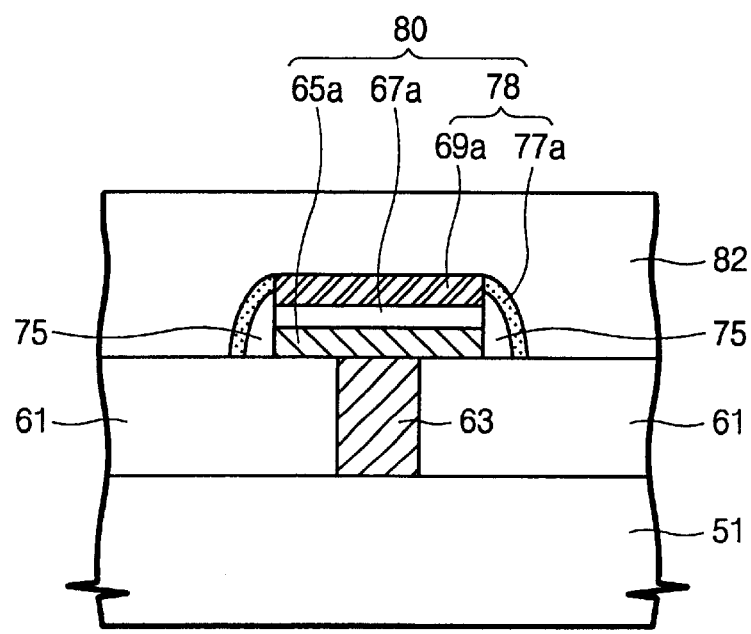
FIG. 2 is a cross-sectional view illustrating a ferroelectric memory in accordance with an exemplary embodiment of the invention.

FIG. 2 is a cross-sectional view illustrating a ferroelectric memory device in accordance with an exemplary embodiment of the invention.

Referring to FIG. 2, insulating layer 61 is disposed on semiconductor substrate 51. A predetermined region of the semiconductor substrate 51 is in contact with contact plug 63 which passes through a predetermined region of the lower interlayer, i.e., insulating layer 61. Lower electrode 65a is located on insulating layer 61 and in contact with contact plug 63. In accordance with this exemplary embodiment, the lower electrode 65a may be a hydrogen barrier layer comprising iridium (Ir), iridium oxide (IrO$_2$) or a combination thereof. Lower electrode 65a is electrically connected to the predetermined region of the semiconductor substrate 51 through contact plug 63. A patterned ferroelectric layer 67a and first upper electrode 69a are sequentially stacked over lower electrode 65a.

Insulating spacer 75 is layered against a sidewall of lower electrode 65a. In a further embodiment, insulating spacer 75 may also be layered against a sidewall of the ferroelectric layer 67a as well as the sidewalls of the lower electrode 65a. A second portion 77a of an upper electrode is layered over an externally facing surface (including sidewalls) of insulating spacer 75. The second portion meets the first portion of upper electrode 69a. As illustrated in this embodiment of FIG. 2, the second portion 77a of the upper electrode comprises a spacer shape. Accordingly, second portion 77a of the electrode is electrically insulated from lower electrode 65a by insulating spacer 75 and is electrically connected to first portion 69a of the upper electrode. First and second upper portions 69a and 77a provide resulting upper electrode, which protects the top surface and sidewalls of the patterned ferroelectric layer 67a.

The first and second portions 69a and 77a of the upper electrode are formed of a hydrogen barrier layer such as, e.g., iridium, iridium oxide or a combination thereof. Accordingly, at least the outwardly facing surfaces (e.g., the top surface and sidewalls) of the ferroelectric layer 67a are protected by the hydrogen barrier layer. Thus, it is possible to prevent hydrogen ions from reaching the ferroelectric layer 67a, which might otherwise deteriorate the ferroelectric layer. The upper electrode 78, the patterned ferroelectric layer 67a and the lower electrode 65a constitute ferroelectric capacitor 80. The ferroelectric capacitor 80 and insulating layer 61 are covered with an upper insulating layer 82, which itself may be an interlayer of an overall device.

FIGS. 3 through 7 are cross-sectional views illustrating a method of fabrication for a ferroelectric memory device according to exemplary embodiments of the present invention. Each drawing shows a portion of a cell array region of the ferroelectric memory device.

Figure 3:
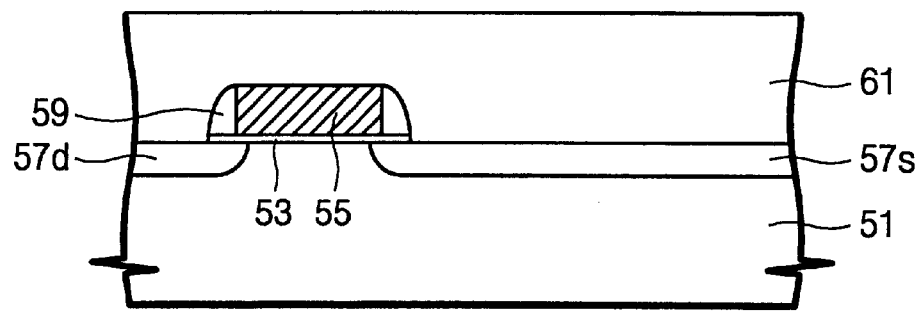
FIGS. 3 through 7 are cross-sectional views illustrating methods of fabricating ferroelectric memory in accordance with exemplary embodiment of the invention.

Referring to FIG. 3, a gate insulating layer 53 and a conductive layer are sequentially formed on semiconductor substrate 51. The conductive layer is patterned to form gate electrode 55 on a predetermined region of the gate insulating layer 53. Using gate electrode 55 as an ion implantation mask, impurity ions are implanted into the semiconductor substrate 51 at a low dose of $1\times10^{12}$ to $1\times10^{14}$ ion atoms/$c\mu^2$, thereby forming source region 57s and drain region 57d on opposite sides of the gate electrode 55. After formation of the source/drain regions 57s and 57d, an insulating layer is formed on an entire surface of gate electrode 55 and the substrate. The insulating layer is anisotropically etched to form gate spacers 59 on the sidewalls of gate electrode 55.

In accordance with another exemplary embodiment, the anisotropical etching process may be applied to only a peripheral circuit region (not shown). In this case, the cell array region is still covered with the insulating layer.

Returning with reference to FIG. 3, a lower interlayer insulating layer 61 is formed over the gate structure and the entire surface of the substrate including the source/drain regions 57a and 57d. The lower interlayer insulating layer 61 in accordance with an exemplary embodiment comprises silicon oxide.

Figure 4:
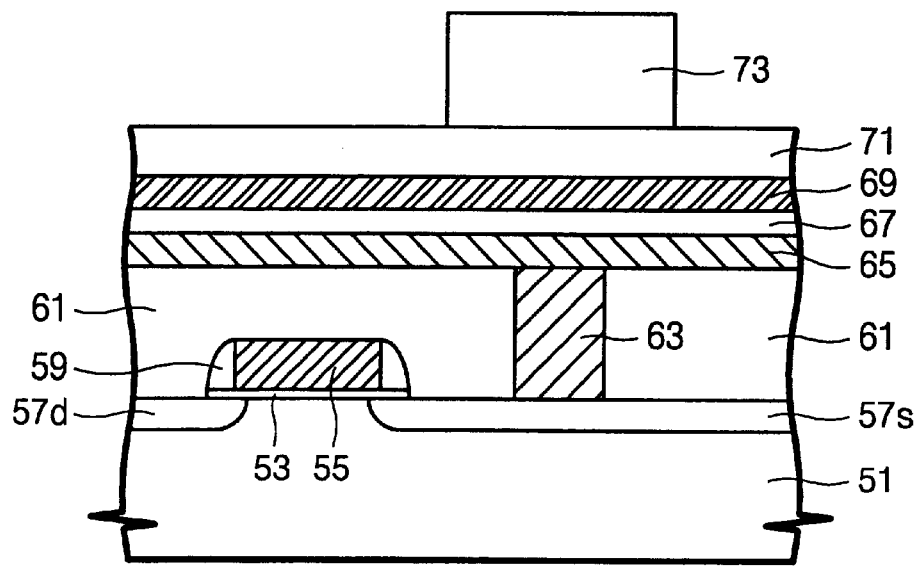

Referring to FIG. 4, the lower interlayer insulting layer 61 is patterned to form a contact hole that exposes a portion of source region 57s. A contact plug 63 is formed in the contact hole using a conventional method. The contact plug 63 may be formed of a metal such as tungsten. A lower electrode layer 65, a ferroelectric layer 67, a first upper electrode layer 69 and a hard mask layer 71 are sequentially formed over the contact plug 63 and insulating layer 61.

The lower electrode layer 65 in this embodiment comprises a hydrogen barrier layer. The hydrogen barrier layer in accordance with exemplary embodiments, may comprise iridium (Ir), iridium oxide (IrO$_2$), or a combination thereof. Additionally, the lower electrode layer 65 may be formed of an oxidation resistant metal such as platinum.

In accordance with further exemplary embodiments, the ferroelectric layer 67 may be formed of a BST (BaSrTiO$_3$) layer or a PZT (PbZrTiO$_3$) layer, or similar ferroelectric material known in the art. Furthermore, electrode layer 69, again as disclosed previously herein relative to FIG. 2, may be formed of a hydrogen barrier layer. Continuing with reference to FIG. 4, hard mask layer 71 may be formed of a material that can be selectivity etched with respect to lower electrode layer 65, the ferroelectric layer 67 and the first upper electrode layer 69. For example, in accordance with certain embodiments, the hard mask layer 71 may comprise one of a silicon oxide layer, a titanium nitride layer or a titanium oxide layer. Subsequently, photoresist 73 is formed and patterned on a predetermined region of the hard mask layer 71.

Figure 5:
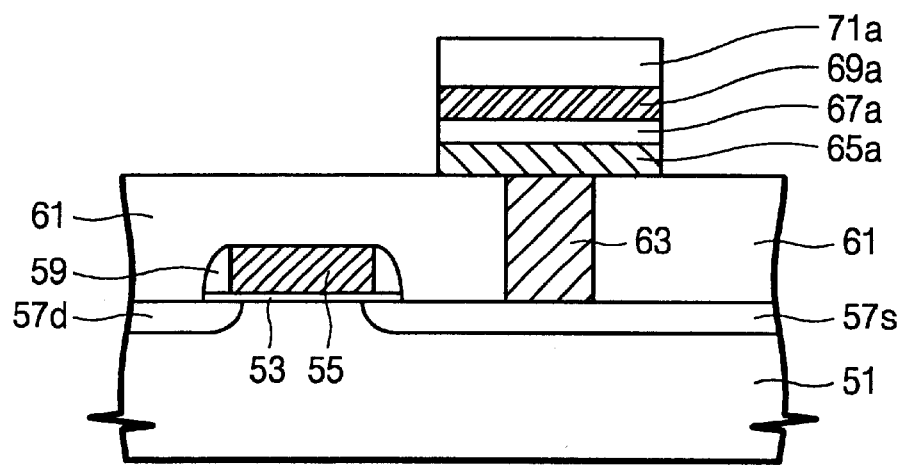

Referring to FIG. 5, using the photoresist pattern 73 as an etching mask, hard mask layer 71 is etched to form a hard mask pattern 71a over the contact plug 63. The photoresist 73 is then removed to expose the hard mask pattern 71a. The electrode layer 69, the ferroelectric layer 67 and the lower electrode layer 65 are sequentially etched using the hard mask pattern as an etching mask, thereby forming the patterned lower electrode 65a, ferroelectric layer 67a and a first portion of upper electrode 69a as a sequential stack over the contact plug 63.

Figure 6:
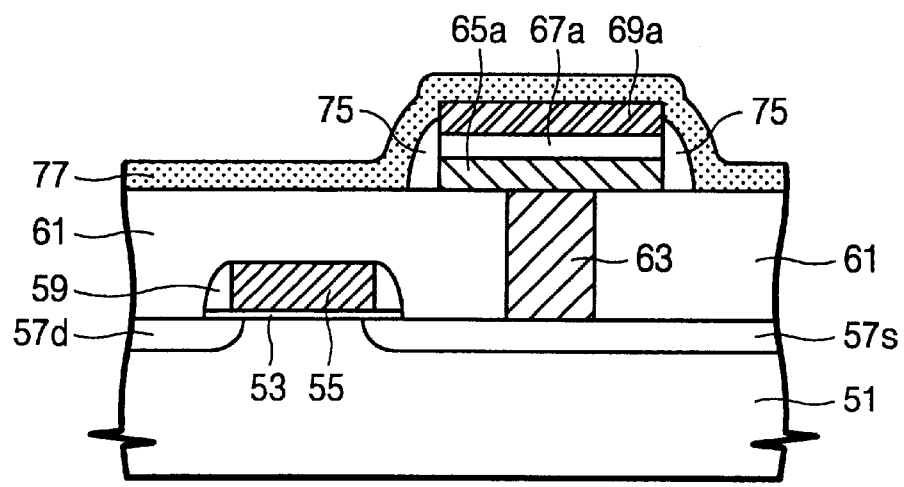

Referring to FIG. 6, after removing the hard mask pattern 71a, an insulating layer is formed over the surface of the electrode-ferroelectric electrode stack and over substrate. Alternatively, the process for removing the hard mask pattern 71a can be omitted. In accordance with particular exemplary embodiments, the insulating layer may be formed of silicon oxide ($SiO_2$), silicon nitride (SiN), titanium oxide ($TiO_2$), aluminum oxide ($Al_2O_3$), a ferroelectric or a combination thereof.

The insulating layer 77 may be anisotropically etched to form insulating spacers 75 to protect the sidewalls of lower electrode 65a. At this time, in accordance with a certain exemplary embodiment, portions of the sidewalls of the first upper electrode 69a should be exposed. Alternatively, the sidewalls of the patterned ferroelectric layer 67a remain protected by the insulating spacer 75.

Next, additional electrode material 77 is formed conformally over the surface of the substrate including the insulating spacers 75. The additional electrode material 77 for the second upper electrode may be formed of a hydrogen barrier material such as iridium, iridium oxide or a combination thereof.

Figure 7:
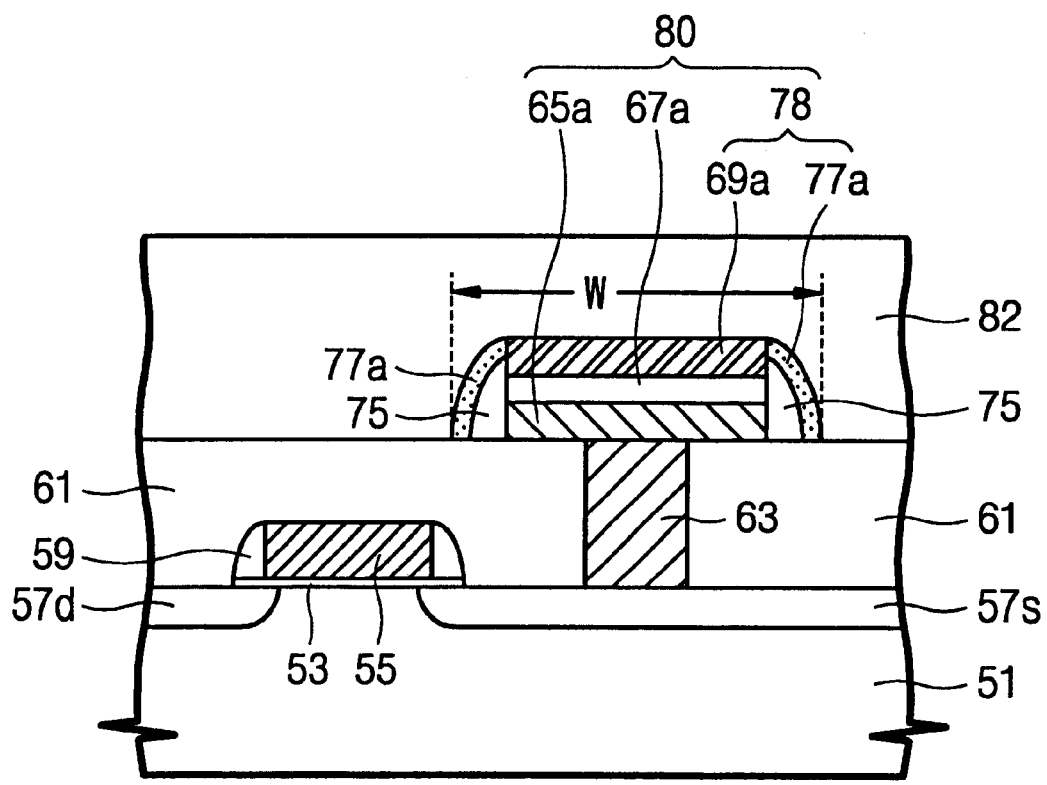

Referring to FIG. 7, the additional electrode material 77 is anisotropically etched to form a second portion 77a of the upper electrode, e.g., which may then be characterized as conductive spacers that meet and cover the exposed regions of the sidewalls of the first upper electrode 69a and cover the outwardly facing surfaces of the insulating spacer 75. Again, in accordance with this embodiment, the second portion 77a of the upper electrode has been formed with a spacer shape that is electrically connected to the first upper electrode 69a. At the same time, the second portion 77a of the upper electrode is electrically insulated from the lower electrode 65a by the insulating spacer 75. Thus, the top surface and the sidewalls of the patterned ferroelectric layer 67a are surrounded by upper electrode 78, which may comprise hydrogen barrier qualities for the first and second electrode portions 69a and 77a. Consequently, even if hydrogen ions are generated during a subsequent processes such as, e.g., during a plasma process, ferroelectric layer 67a is protected from the hydrogen ions. Moreover, in the event that the lower electrode 75a comprises hydrogen barrier qualities, it is possible to further suppress the injection of hydrogen ions into the ferroelectric 67a. Again, lower electrode 75a, the patterned ferroelectric layer 67a and upper electrode 78 constitute ferroelectric capacitor 80.

Subsequently, in accordance with further exemplary embodiments of the present invention, an upper interlayer insulating layer 82 may be formed on the entire surface of the resultant structure with ferroelectric capacitor 80. Subsequently, although not shown in the exemplary figures, the upper insulating layer 82 may be patterned to form a plate line contact hole that exposes the upper electrode 78. Importantly, upper electrode 78 may comprise first and second portions together which are wider than just the first portion 69a alone, as shown in FIG. 7. Thus, an alignment margin during photolithography processing, which may be associated with the formation of the plate line contact hole to expose the upper electrode 78, is better with the wider electrode structure over that provided by the first portion 69a alone.

As described above, according to exemplary embodiments of the invention, at least the top surface and the sidewalls of the patterned ferroelectric layer are covered with the upper electrode that may comprise a hydrogen barrier material. Hence, it may be possible to prevent the hydrogen ions from being introduced into the ferroelectric. Consequently, degradation of the ferroelectric capacitor may be suppressed and realization of high performance ferroelectric memory device achieved.

What is claimed is:

1. A ferroelectric memory comprising:
   a substrate;
   an insulating layer on the substrate;
   a lower electrode-ferroelectric-upper electrode stack on the insulating layer; and
   an insulating spacer covering at least a portion of the sidewalls of the stack, the portion including the lower electrode of the stack,
   wherein the upper electrode includes an extending portion disposed over and covering the insulating spacer, the extending portion being electrically insulated from the lower electrode.

2. The ferroelectric memory according to claim 1, further comprising a contact plug through the insulating layer, the lower electrode electrically connected to a predetermined region of the substrate via the contact plug.

3. The ferroelectric memory according to claim 1, wherein the insulating spacer comprises at least one of silicon oxide ($SiO_2$), silicon nitride (SiN), titanium oxide ($TiO_2$), aluminum oxide ($Al_2O_3$) and ferroelectric.

4. The ferroelectric memory according to claim 1, wherein the ferroelectric layer comprises at least one of BST ($BaSrTiO_3$) and PZT ($PbZrTiO_3$).

5. The ferroelectric memory according to claim 1, wherein the upper electrode of the stack including the extending portion comprise a hydrogen barrier layer.

6. The ferroelectric memory according to claim 5, wherein the hydrogen barrier layer comprises at least one of iridium (Ir) and iridium oxide ($IrO_2$).

7. The ferroelectric memory according to claim 6, wherein the hydrogen barrier layer comprises a combination of iridium (Ir) and iridium oxide ($IrO_2$).

8. The ferroelectric memory according to claim 1, wherein the extending portion is formed conformally as a spacer contacting an outwardly facing surface of the insulating spacer.

9. A ferroelectric memory comprising:
   a substrate;
   an insulating layer on the substrate;
   a capacitor stack comprising:
      a lower electrode;
      a ferroelectric layer formed on the lower electrode; and
      an upper electrode formed on the ferroelectric layer; and
   an anisotropically-etched insulating spacer formed on sidewalls of the capacitor stack,
   wherein the upper electrode comprises a portion overlying and covering the anisotropically-etched insulating spacer.

* * * * *